United States Patent
Turner et al.

(10) Patent No.: US 9,921,264 B2
(45) Date of Patent: Mar. 20, 2018

(54) METHOD AND APPARATUS FOR OFFLINE SUPPORTED ADAPTIVE TESTING

(71) Applicant: International Business Machines Corporation, Armonk, NY (US)

(72) Inventors: Andrew A. Turner, Underhill, VT (US); Hunter Feng Shi, Glendale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/133,666

(22) Filed: Apr. 20, 2016

(65) Prior Publication Data
US 2017/0307679 A1    Oct. 26, 2017

(51) Int. Cl.
*G01R 31/28* (2006.01)

(52) U.S. Cl.
CPC ................... *G01R 31/2851* (2013.01)

(58) Field of Classification Search
CPC ........ G01R 31/31924; G01R 31/31922; G01R 35/00; G01R 31/2851
USPC .................................................. 324/750.01
See application file for complete search history.

(56) References Cited

U.S. PATENT DOCUMENTS

| | | | | |
|---|---|---|---|---|
| 6,546,524 B1 * | 4/2003 | Chankramath | | G01R 31/318314 702/121 |
| 7,107,202 B1 * | 9/2006 | Hegde | ................. | G06F 17/5022 370/250 |
| 2012/0203533 A1 * | 8/2012 | Jacobus | ................ | G06F 11/261 703/14 |
| 2014/0059386 A1 | 2/2014 | Atkinson et al. | | |
| 2015/0058668 A1 | 2/2015 | Fan et al. | | |
| 2015/0127986 A1 | 5/2015 | Tahara | | |

* cited by examiner

*Primary Examiner* — Patrick Assouad
*Assistant Examiner* — Haidong Zhang

(57) ABSTRACT

In various embodiments, the disclosure relates to a hardware test generation environment for developing test tool analysis workflows. Configurable flow files direct the steps, procedures, and data acquisitions associated with device testing and can be flexibly deployed and updated in connection with a variety of electronic test tools. The hardware test generation environment may operate separately from the hardware test execution environment allowing device test protocols and methodologies to be independently developed, improved, and validated.

1 Claim, 3 Drawing Sheets

METHOD AND APPARATUS FOR OFFLINE SUPPORTED ADAPTIVE TESTING

BACKGROUND

Field

The disclosure relates to a method, apparatus, and system to facilitate electronic device testing. Specifically, the disclosure relates to a method, apparatus, and system to provide device test programs and workflows that generate and execute adaptive specifications and flow files for tools used for testing electronic devices.

Description of Related Art

Operation of electronic test hardware used to validate the integrity and reliability of integrated circuits, wafers, and other electronic components is directed by programs and instructions that define test behaviors, data collection characteristics, and expected results. An increasingly diverse and complex universe of electronic components and devices creates difficulties in configuring new and existing electronic test hardware appropriately to address each specific component and associated test protocol.

As one example, integrated circuit testers are typically configured to execute comprehensive batteries of tests during various manufacturing stages of an integrated circuit as well as validate the final product. These testers execute specific test programs or workflows designed to evaluate the integrated circuit and collect data in response to each test. The testing procedures, expected device behaviors, and acceptable output ranges vary significantly between different integrated circuit designs and may also be different within similar or identical manufacturing lots resulting in numerous and complex test protocols and workflows.

Test hardware may also be tedious and difficult to appropriately configure in a manner that accommodates a wide array of desired test protocols. This is especially true of legacy test apparatus which may be hindered by lack of processing power and memory or poor user interface design and functionality. These limitations can prevent test programs and apparatus from performing desired operations such as being responsive to device-to-device conditions or defects. Executing customized test plans responsive to individual variations between electronic devices as well as collecting associated test data results in complicated test workflows and extensive datalogs that are both challenging and time-consuming to work with. Consequently, there is a need for a method and apparatus that provides more flexible approaches to electronic test device development that overcome these and other deficiencies of the art.

SUMMARY OF THE INVENTION

According to one embodiment, a method of testing a device includes determining an adaptation command for testing the device at an adaptive testing engine using data obtained from a device testing program that tests the device; sending the adaptation command from the adaptive testing engine to a tool control application; and using the adaptation command at tool control application to control an operation related to the testing of the device.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
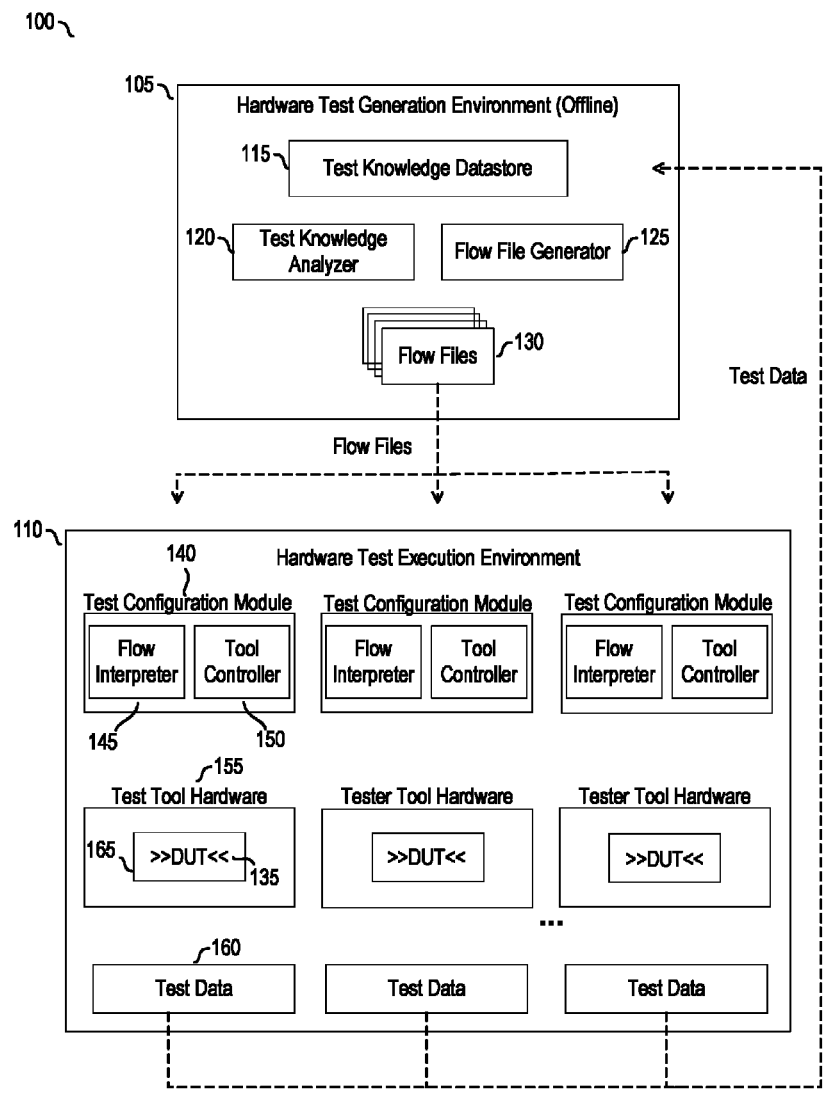
FIG. 1 depicts an embodiment of an architecture for electronic hardware testing according to the present disclosure.

FIG. 1 depicts an exemplary architecture 100 for electronic hardware testing according to the present disclosure. The architecture 100 desirably provides a test environment suitable for implementation in connection with existing/legacy test apparatus and improves the ability of such components to be responsive to different test parameters and hardware conditions using flexibly configured and deployed test protocols. The architecture 100 comprises a hardware test generation environment 105 and a hardware test execution environment 110. The hardware test generation environment 105 further comprises a test knowledge datastore 115, a test knowledge analyzer 120, and a flow file generator 125. As will be described in greater detail hereinbelow, together these components are used to develop configurable flow files 130 that specify test protocols and parameters used within the hardware test execution environment 110 for testing a selected/desired device under testing or "DUT" 135.

The DUT 135, also known as equipment under test (EUT) and unit under test (UUT) may refer to any electronic assembly for which testing is desired. For example, newly fabricated or assembled electronic components may be subjected to various interim and final tests. The electronic components may comprise, for example, individual chips, such as integrated-circuit chips on a wafer, integrated circuits in a module, package or multi-component electronic devices such as computers, cell phones, electronic appliances, etc. The DUT 135 may comprise a plurality of DUTs from a sample bin, sample group/collection, manufacturing/assembly lot. The DUT 135 may have an associated part number, lot number, or group number for identification or inclusion in a given sample group or collection. The DUT 135 may be in any stage of manufacturing, including a completed product.

The hardware test execution environment 110 comprises a test configuration module 140 including a flow interpreter 145 and tool controller 150 that direct the operation of selected test tool hardware 155 which perform testing of an associated DUT 135 according to instructions and parameters determined at least in part from flow files(s) 130. During testing, test data 160 is collected from the DUT 135 and may include details related to its identify, performance, or test conditions. The test data 160 is leveraged by the hardware test generation environment 105 for analysis and subsequent flow file generation in a manner that will be described in greater detail hereinbelow.

According to various embodiments, the hardware test generation environment 105 may be desirably configured to operate partially or completely independent of the hardware test execution environment 110. Operating in such an "offline" mode may desirably facilitate decouple processes related to test data analysis and flow file design from flow file execution and DUT testing. Such configurations further allow for flexible implementation of testing protocols on a variety of test platforms reducing complexities associated with programming test tool hardware and increasing the adaptability of the test instruments to changes in test protocols that may be subject to updates based on performance characteristics and test feedback obtained from DUTs 135. A particular benefit may also be realized in connection with legacy test instruments which due to limitations in processing power or memory may have limited ability to be configured to accommodate a wide range of test protocols or may be difficult to configure to address complex test workflows responsive to many different potential DUT conditions.

In an exemplary embodiment, within the hardware test execution environment 110 test tool hardware 155 selects the DUT 135 for testing by operation a handler 165. The handler 165 may include various subsystems such as a DUT selector, probe, probe cleaner, etc., that are used to manipulate various physical aspects of the testing process. The handler 165 may select a particular DUT 135 from a sample group and position probes or other sampling devices in proximity to the selected DUT's location as well as reposition the DUT 135 following testing and advance to a new DUT 135 after a test is completed. In one exemplary embodiment, the handler 165 may be configured to position an integrated circuit or wafer DUT 135 into a testing socket/receiver for testing and remove the integrated circuit or wafer from the testing socket/receiver once a test is completed. The handler 165 may further be controlled by the test tool hardware 155 according to various parameters and instructions associated with a flow file 130.

In various embodiments, the test tool hardware 155 associated with the hardware test execution environment 110 comprises a programmable instrument/device configured to execute various operations and data acquisitions for the selected DUT 135. For example, the test tool hardware 155 may apply power to an electronic component being tested or supply stimulus signals and thereafter acquire the resulting outputs from the device. Acquired parameters and ranges of expected operation and performance for the electronic component may be supplied or defined by the flow file 130 and may be specific for a particular electronic component or a range of electronic components being tested. In various embodiments, the test configuration module 140 receives or is provided with a flow file 130 generated within the hardware test generation environment 105. The flow file 140 is processed by the flow interpreter 145 establishing a selected test protocol including test parameters, expected electronic device performance characteristics or ranges, data output to be evaluated/collected and defines the conditions for which a particular electronic component(s) under test by the test tool hardware 155 meets the specifications (e.g. pass/fail conditions). The flow file 140 further specifies instructions interpreted by the tool controller 150 to direct operation of the test tool hardware 155 to perform desired tests and data acquisitions on the DUT 135.

The test tool hardware 155 may include a number of programs that may be operated by one or more processors in order to perform various testing procedures on the DUT 135 according to conditions and parameters set forth in an associated flow file 130. Exemplary programs that may be developed from an associated flow file 130 include a device test program for performing tests on the DUT 135, test tool control applications for providing supervision of the device test program as well as for performing additional tasks related to the testing process, and data acquisition or sniffing applications for extracting data from the DUT 135.

In one aspect, test data 160 acquired by the test tool hardware 155 is collected and saved for subsequent analysis by the hardware test generation environment 105. The test data 160 may also provide feedback used in the operation of the test tool hardware 155 governed by the parameters and instructions associated with the corresponding flow file 130. The flow file 130 may include rules and algorithms that determine additional commands or directives that control operation of the test tool hardware 155 based on the data and characteristics acquired from the DUT 135 under testing.

The test tool hardware 155 administers tests to the DUT 135 based on instructions, parameters, and conditions set forth by the flow file 130. The test tool hardware 155 may further assemble test data 160 and transmit the test data 160 over an interface to a storage location such as the test knowledge datastore 115 of the hardware test generation environment 105 or save test data locally 160 for subsequent retrieval. In various embodiments, the test configuration module 140 may control the selection of DUTs 135 for testing or for retesting. Based on obtained measurement data, the test configuration module 140 may select a DUT 135 for further testing, data collection, characterization tests, etc. The test configuration module 140 may further be configured with a specific program for running the tool controller 150 by instructions contained in the flow file 130.

In various embodiments, the test tool hardware 155 may perform operations including, but not limited to, sending signals to the DUT 135, receiving signals from the DUT 135 in response to the sent signals, determining a condition or pass/fail status of the DUT 135 based, at least in part, on the received signals, and storing test data 160, including for example DUT response data and test results to a database or data file.

Various communication means may be used to transfer the test data 160 from the hardware test execution environment 110 to the hardware test generation environment 105. For example, the hardware test execution environment 110 and the hardware test generation environment 105 may communicate by wired, wireless, or network connectivity means to exchange test data 160 and flow files 130. Alternatively, the test data 160 and flow files 130 may be stored locally and saved on media capable of being read and recovered by the hardware test execution environment 110 and the hardware test generation environment 105.

In various embodiments, control of a behavior of the test tool hardware 155 is enabled by obtaining preliminary test data or extraction of configuration information from the DUT 135 being tested. This data or information may aid in the determination of selecting an appropriate flow file 130 to be utilized by the test configuration module 140 and result in additional instructions being loaded by the tool controller 150 for test tool hardware 155 configuration. In various embodiments, the preliminary test data or extraction of configuration information from the DUT 135 may be acquired by the handler 165 interacting with a selected DUT 135 with subsequent test tool instructions extracted and processed in real time.

As shown in FIG. 1, the hardware test execution environment 110 may include multiple quantities and different types of test configuration modules 140, test tool hardware 155, and DUTs 135. As noted previously, a large variety of different test protocols may be required to test individual DUTs 135. These test protocols vary not only in terms of the DUT 135 under testing but may also vary from one test tool hardware component 155 and/or associated handler 165 to the next. A typical hardware test execution environment 110 may include different test tool hardware components 155 and/or associated handler 165 from different manufacturers, having different capabilities, or requiring different programs and instructions for operation. Similarly, the data handling capabilities, data sampling characteristics, and data storage formats may vary between components within the hardware test execution environment 110. Taken together, these differences make it difficult to maintain and update operation of the various components hardware test execution environment 110 in a uniform and reliable manner.

According to various embodiments of the present disclosure, control and management of complex testing workflows for DUTs 135 is conveniently managed using pre-generated flow files 130 provided by the hardware test generation environment 105. These flow files 130 can be transmitted or injected into the hardware test execution environment 110 and interpreted by the flow interpreters 145 of respective test configuration modules 140 which can further route or process the instructions and information contained in the flow files 130 depending upon the information contained therein. Specific flow files 130 can further be loaded directly into a respective test configuration module 140 for processing and carrying out a desired test protocol.

The hardware test generation environment 105 can be configured in a manner to simulate or emulate the hardware test apparatus, DUTs, tests, conditions, and output data to generate appropriate hardware test protocols, validation parameters, and expected data ranges for each type of DUT 135 and/or each type of test tool hardware 155 that are captured in one or more flow files 130. Additionally, the hardware test generation environment 105 can leverage previous existing test knowledge and data 160 obtained from DUT testing analyzing this information in an "offline" manner without tying up or consuming resources from the hardware test execution environment 110. Such an approach desirably improves DUT testing throughput while permitting highly flexible configuration of the hardware test execution environment 110 as needed or desired.

In a dynamic testing environment where many devices are subject to testing, it is desirable to provide the ability to react to previously known or observed conditions without having to manually reprogram or retask the test tool hardware 155. For example, it may be desirable to implement a test environment that is responsive to specific conditions and in-line test data associated with a particular device lot/group or even within the same device itself or within the same wafer. It may further be desirable to perform customizable test protocols and workflows on a device by device bases. In some instances, certain decision points or test results may be desirably selectively reported or collected without having to obtain and review a complete data log or result output from a device test protocol such that additional device testing can be performed based on the selected output or results.

While certain adaptive methods for testing may be available on new electronic test instruments, such methods are not suitable for implementation with older hardware/testers due to problems such as limited computing power/memory, lack of network connectivity, or other limitations in configurability. The system, apparatus, and methods of the present disclosure, desirably provide a test protocol design and implementation approach compatible with such existing instruments while improving the flexibility and responsiveness of such systems allowing them to be more readily configured and responsive to modern testing demands and requirements.

Figure 2:
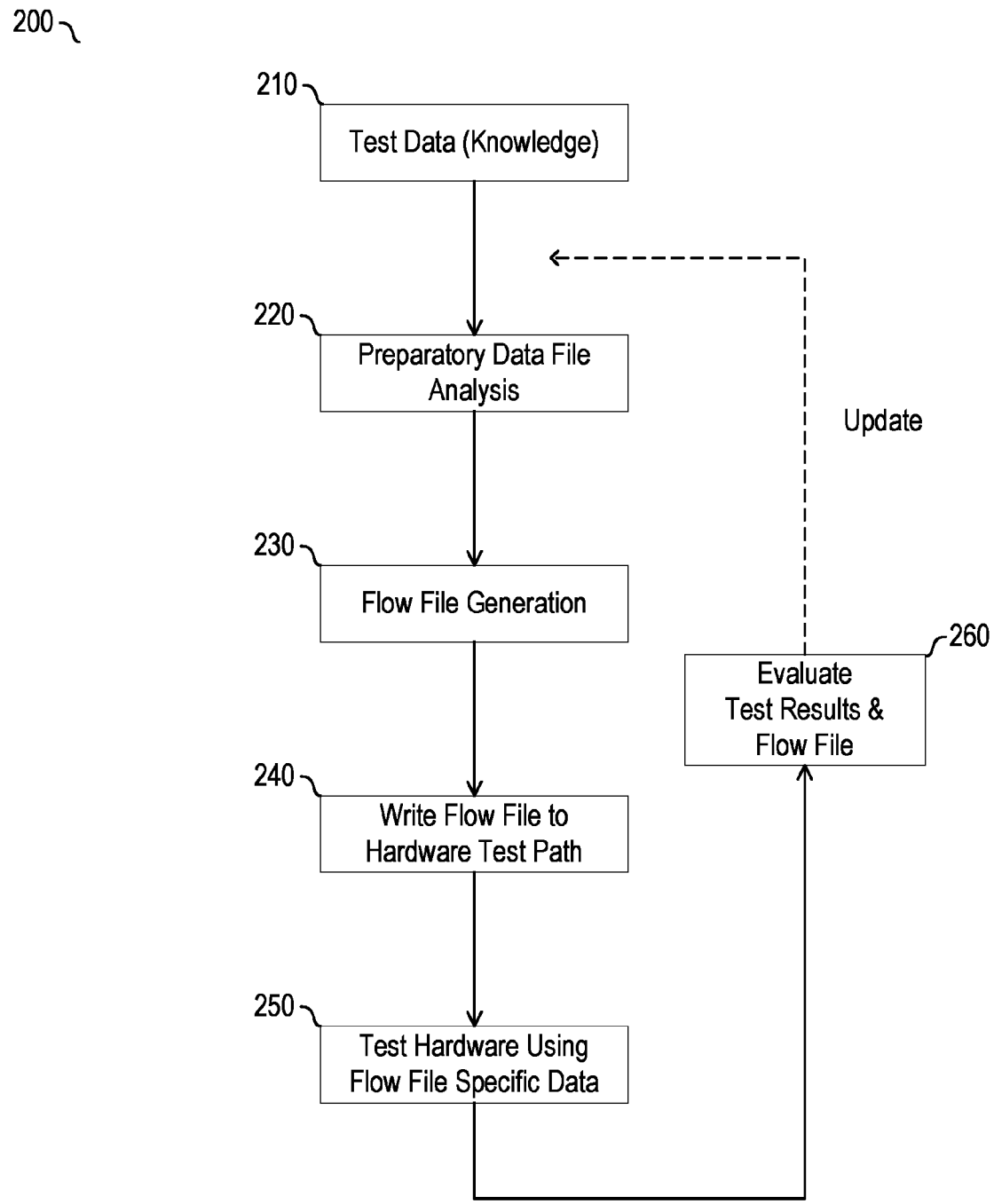
FIG. 2 depicts an embodiment of a method for generation of flow file test solutions used in electronic hardware testing according to the present disclosure.

FIG. 2 depicts an embodiment of a method 200 for generation of flow file-based test solutions used in electronic hardware testing according to the present disclosure. As previously discussed, flow files provide instructions, test parameters, conditions, and data sampling requirements for respective DUTs 135 and associated test tool hardware 155. Flow files 130 may be generated based, in part, upon a set of known or existing test data associated with testing of a selected DUT 135 type using specified test tool hardware 155. As shown in state 210, the test data may be collected and used a basis of existing knowledge for test protocol development. The collection of test data may include test data from a particular DUT that is evaluated along with data from other related DUTs 135 with similar manufacturing histories, processing environments, or expected test results/data output. In state 220, preparatory analysis of available DUT test data and knowledge may be evaluated to establish expected operational ranges, output results, valid/invalid inputs, and other parameters associated with testing of a particular type, class, or family of DUTs 135.

In various embodiments, the test data and knowledge may be leveraged to establish (new and updated) test protocols that address questions or testing requirements, establish conditions or test parameters, identify appropriate test workflows and develop workarounds, updates or testing alternatives to avoid potential problems or issues during testing. In state 230, one or more flow files are generated representative of the test protocol/design, specific/general test tool instructions, expected test ranges/data outputs, and test data to be collected.

In state 240, the one or more flow files are written or transferred to a hardware test path designed to determine the outcome of DUT testing according to the current flow file. In state 250, the flow file is processed where test hardware executes or proceeds according to the instructions, parameters, and rules set forth in the previously generated flow file and collects outputs/data/results. The hardware test path may be processed on emulated test hardware or leverage actual test hardware. In various embodiments, the test environment may be effectively emulated/simulated leveraging existing test program knowledge and DUT behaviors, providing multiple decision points and expected outcomes for selected test programs, and utilizing existing flow files with associated test results/data.

In step 206, following execution of the flow file/hardware test, the hardware test generation environment 105 evaluates test outcomes to determine if desired/expected conditions, outputs and results were achieved. Test results are also evaluated to determine if new problems or conditions can be identified and the suitability of the flow file to address the problems or conditions. In various embodiments, successive testing and updating/refinement of the flow file can be performed where the test parameters and instructions for a selected flow file or test methodology can be improved, refined, updated, or made more complete. Additionally, as more actual test data from DUTs 135 processed in the hardware test execution environment 110 becomes available, existing flow files can be reevaluated and updated. Such an approach to flow file generation aids in improving DUT testing protocols and can leverage test data from successive lots or manufacturing runs in flow file development without having to stop current/actual DUT testing.

Flow files generated by the method 200 may be successively modified to effect different behaviors in the test tool hardware 155, perform additional DUT tests, and acquire associated test data. Updated flow files may be passed to the hardware test execution environment 110 and used for retesting of DUTs based on results observed in a prior test and for which updated flow files have been generated leveraging the newly acquired test data knowledge. In this manner, DUTs 135 that may have passed or failed under a selected protocol may be re-evaluated using the updated flow file.

The disclosed method 200 for flow file generation and successive evaluation/refinement advantageously provides flexibility and the ability to be adaptive to findings and results from newly acquired test data. This test data may be used in test protocol development without extensive test tool hardware downtime that might otherwise result from having to iteratively re-program these devices as incremental flow file changes are identified and made. Flow files can be tested, refined, and validated extensively in the offline hardware test generation environment 105 and rolled out or implemented in the hardware test execution environment 110 when desired. Offline testing in this manner additionally provides the ability to develop robust test programs/protocols and identify potential faults, omissions, or test problems that might for example result in DUT test failure or reduce overall throughput in DUT testing especially in connection with legacy test hardware.

Figure 3:
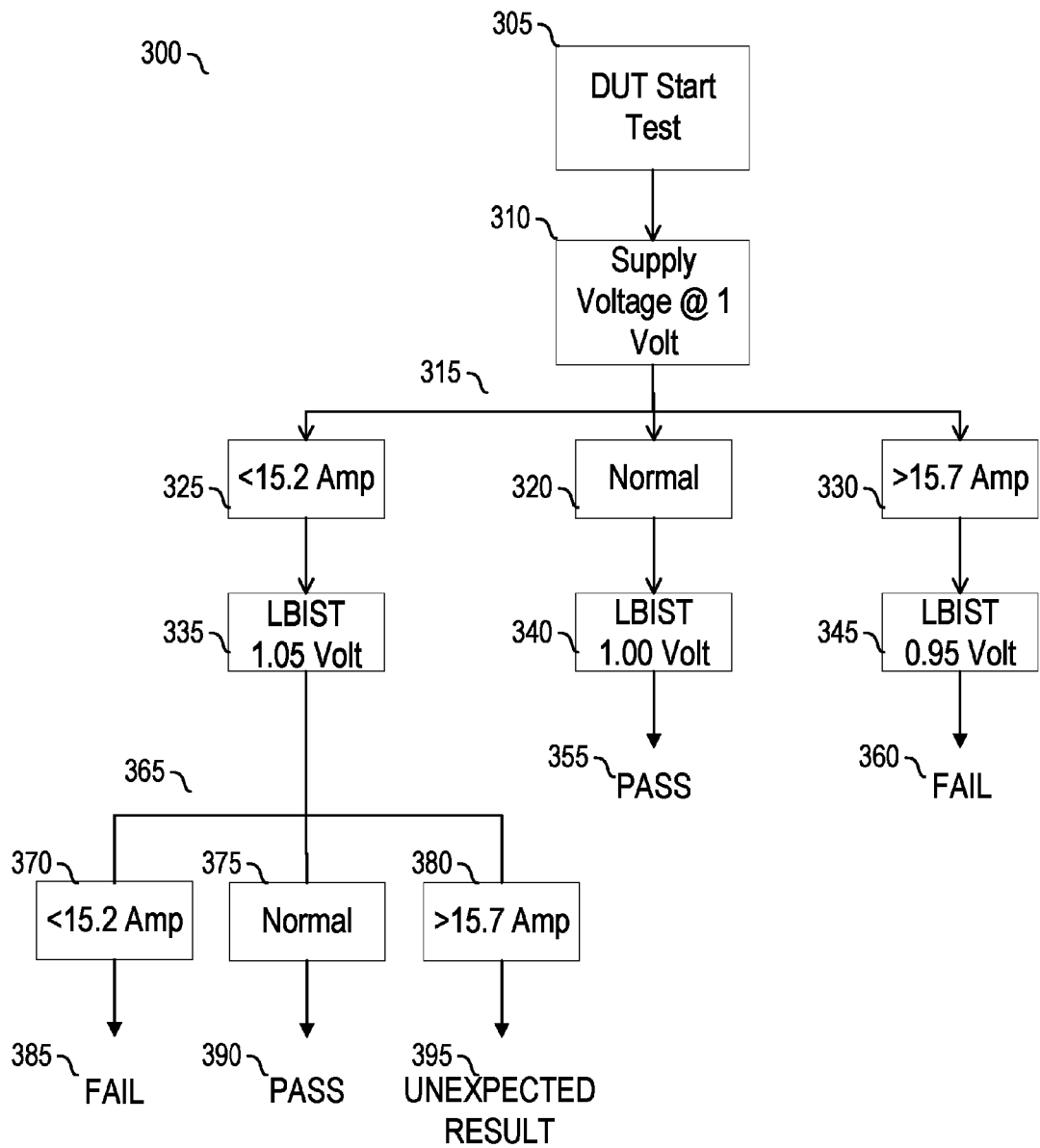
FIG. 3 depicts an exemplary test protocol flow responsive to test point information according to the present disclosure.

FIG. 3 illustrates an exemplary test protocol flow 300 for a DUT test procedure related to an integrated circuit manufacturing fault test that may be developed in connection with the flow file method 200 described in FIG. 2. In various embodiments, new or updated test protocol flows may be identified based on knowledge/insights obtained during actual DUT testing and determined by analyzing the test data 160. DUT testing flows initiated in state 305 may be based on existing test protocol flow paths and established normal or expected test ranges or output data/results. Such flow paths may be updated with new parameters, test conditions, or data outputs to improve the test protocol.

For example, supply voltage data analysis 310 may occur during a selected integrated circuit test wherein sampling of the voltage and comparing to expected ranges takes place. Analysis of test data using the hardware test generation environment 105 may further indicate that DUTs with a selected supply voltage (show by way of example as 1 volt) are subject to failure or rejection and should have additional tests performed to validate the performance of the selected DUT 135. An additional test flow 315 may be implemented, for example, nominal supply current evaluation, which is then measured or considered as part of the test protocol flow 300. Test data and knowledge may further direct additional tests, actions and set forth expected ranges based on the test data. In the example, output test data or samplings from the test flow 315 identify expected normal ranges 320 as well as upper 325 and lower 330 boundary conditions each of which may proceed along a discrete or independent analysis path resulting in different/additional data analysis and tests performed.

In the example, a further test of the integrated circuit includes a logic built-in self-test (LBIST) that evaluates the DUT voltage. Depending on the previous test range (320, 325, 330) and a current test range (335, 340, 345) for the integrated circuit may pass 355, fail 360, or be subjected to further testing or analysis 360. The flow file associated with these tests, decision points, and data range may further update and set forth additional test ranges 370, 375, 380 and associated results 385, 390, 395. As shown in the example, an unexpected data flow result 395 may be identified during the test protocol flow analysis 300. In an actual DUT testing environment, such a condition might interrupt testing if encountered and result in undesirable test tool downtime to identify and resolve the condition. Within the hardware test generation environment 105 however, such a result can be identified and the associated flow file updated to correct or address the condition. Thus, rather than having to recode large portions or the entire test protocol for a selected test tool 135, data collection and test tool procedure changes and additions may be quickly and conveniently appended to existing test tool protocols through updates reflected in the associated flow file. In this manner, DUT testing procedures and protocols can be more readily refined and improved without requiring expensive and time-consuming development, verification, regression, and/or release cycles. For example, such an unexpected result may be indicative of manufacturing issues that merit additional investigation or suggestive of additional testing that may be performed to further qualify or validate the DUT.

In various embodiments, the hardware test generation environment 105 can leverage commonality in analysis flows where flow file steps and procedures comprise sequences of steps that are common or similar to each other. In such instances, the flow files may be configured with macros that simplify such procedures, helping to make them easier to visualize and simulate, especially where long sequences of steps can be reflected or collected in a macro form.

A particularly desirable feature of the present disclosure is that DUT analysis and flow file creation may be abstracted or generalized across multiple different types of components. Such an approach can be helpful in hardware test execution environments 110 which may include different types or versions of test tool hardware 155. Leveraging the hardware test generation environment 105 capabilities, test procedures and workflows can be developed using "wrappers" capable of being interpreted and translated by the flow interpreters 145. In various embodiments, the present disclosure enables flow files to be standardized, for example, in a common/singular form and implemented across multiple different test platforms without having to independently write discrete or individual file flows specific for each test protocol.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While the principles of the disclosure have been illustrated in relation to the exemplary embodiments shown herein, the principles of the disclosure are not limited thereto and include any modification, variation or permutation thereof.

What is claimed is:

1. A system for implementing electronic test tool protocols for integrated circuit testing, comprising a processor circuitry in communication with a memory circuitry, the processor circuitry and the memory circuitry further comprising:
 a memory storage knowledge datastore that includes test data obtained from testing at least one integrated circuit by at least one electronic test tool;
 a knowledge analyzer processor that evaluates the test data in association with a test tool protocol reflecting operations performed by the at least one electronic test tool used to test the at least one integrated circuit and further including expected results to validate the at least one integrated circuit;
 a flow file generator processor that generates at least one flow file comprising test parameters and expected results associated with the validation of the at least one integrated circuit that are generalized and independent of electronic test tool specific configuration instructions, the flow file further tested at an offline mode decoupled from the electronic test tool and without interruption of the operation of the electronic test tool by emulating operations performed by the electronic test tool and the expected results obtained by the electronic test tool used for validating the at least one integrated circuit according to the test tool protocol, wherein the flow file is iteratively evaluated and updated with additional test parameters applying test data from the knowledge analyzer to refine the test tool protocol; and
 a flow file interpreter processor that receives the at least one flow file and translates the at least one flow file into electronic test tool specific configuration instructions that direct operation of the electronic test tool according to the test parameters of the test tool protocol and collect test data from testing of the integrated circuit, at least a portion of the test data captured and provided to the knowledge datastore.

* * * * *